(12) United States Patent
Bentley et al.

(10) Patent No.: US 9,293,324 B2
(45) Date of Patent: Mar. 22, 2016

(54) METHODS OF FORMING SEMICONDUCTOR DEVICES INCLUDING AN ELECTRICALLY-DECOUPLED FIN

(71) Applicant: GLOBALFOUNDRIES, Inc., Grand Cayman (KY)

(72) Inventors: Steven Bentley, Watervliet, NY (US); Ajey P. Jacob, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/274,406

(22) Filed: May 9, 2014

(65) Prior Publication Data

US 2015/0325436 A1    Nov. 12, 2015

(51) Int. Cl.
   H01L 21/02    (2006.01)
   H01L 29/78    (2006.01)
   H01L 29/66    (2006.01)
   H01L 29/20    (2006.01)

(52) U.S. Cl.
   CPC .......... *H01L 21/02538* (2013.01); *H01L 29/20* (2013.01); *H01L 29/66795* (2013.01); *H01L 29/785* (2013.01)

(58) Field of Classification Search
   None
   See application file for complete search history.

(56) References Cited

U.S. PATENT DOCUMENTS

| | | | |
|---|---|---|---|
| 2012/0292707 A1* | 11/2012 | Toh et al. | 257/365 |
| 2013/0168771 A1* | 7/2013 | Wu et al. | 257/351 |
| 2014/0332892 A1* | 11/2014 | Chang et al. | 257/365 |
| 2015/0076561 A1* | 3/2015 | Cheng et al. | 257/192 |

OTHER PUBLICATIONS

Gu et al., "Effects of gate-last and gate-first process on deep submicron inversion—mode InGaAs n-channel metal-oxide-semiconductor field effect transistors", Journal of Applied Physics, 2011, pp. 053709-1-053709-6, vol. 109.
Jurczak et al., "Silicon-on-Nothing (SON)—an Innovative Process for Advanced CMOS", IEEE Transactions on Electron Devices, Nov. 2000, pp. 2179-2187, vol. 47, No. 11.
Park et al. Abstract—"Defect reduction of selective Ge epitaxy in trenches on Si(001) substrates using aspect ratio trapping", Applied Physics Letters, 2007, p. 052113, vol. 90.
Richards et al. Abstract—"Etch Pits in Gallium Arsenide", Journal of Applied Physics, 1960, p. 611, vol. 31.
Stirland, Abstract—"Quantitative defect etching of GaAs on Si: Is it possible?", Applied Physics Letters, 1988, p. 2432, vol. 53.
Weyher, "Defect-Selective Etching of III-V and Wide Gap Semiconductors", Proceedings of Cephona, 2003, pp. 1-7.

\* cited by examiner

*Primary Examiner* — Michael Jung
(74) *Attorney, Agent, or Firm* — Ingrassia Fisher & Lorenz, P.C.

(57) ABSTRACT

Semiconductor devices including a fin and method of forming the semiconductor devices are provided herein. In an embodiment, a method of forming a semiconductor device includes forming a fin overlying a semiconductor substrate. The fin is formed by epitaxially-growing a semiconductor material over the semiconductor substrate, and the fin has a first portion that is proximal to the semiconductor substrate and a second portion that is spaced from the semiconductor substrate by the first portion. A gate structure is formed over the fin and the semiconductor substrate. The first portion of the fin is etched to form a gap between the second portion and the semiconductor substrate.

16 Claims, 4 Drawing Sheets

METHODS OF FORMING SEMICONDUCTOR DEVICES INCLUDING AN ELECTRICALLY-DECOUPLED FIN

TECHNICAL FIELD

The technical field generally relates to semiconductor devices that include a fin and methods of forming the same. More particularly, the technical field relates to semiconductor devices having fins with a portion thereof including III-V semiconductor material and methods of forming the same.

BACKGROUND

Semiconductor devices find a wide range of applications in the electronics industry. For example, transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A Fin field-effect transistor (FinFET) is a type of transistor that lends itself to the dual goals of reducing transistor size while maintaining transistor performance. The FinFET is a three dimensional transistor formed with a thin fin that extends upwardly from a semiconductor substrate. Transistor performance, often measured by its transconductance, is proportional to the width of the transistor channel. In a FinFET the transistor channel is formed along the vertical sidewalls of the fin or on both vertical sidewalls and the top horizontal plane of the fin, so a wide channel, and hence high performance, can be achieved without substantially increasing the area of the substrate surface required by the transistor.

FinFETs provide a promising candidate for small line width technology (e.g., approximately 22 nm and below) because of their excellent short channel effect control and scalability. For future technology nodes, high mobility III-V channel materials may be desired, with the fins including the III-V channel materials in the channel region of the fins. The III-V channel material may be epitaxially-grown on a semiconductor substrate, such as a silicon substrate. However, due to differences in the crystal lattices between the III-V materials and silicon, unwanted defects are generally prevalent at a portion of the fin that is proximal to the semiconductor substrate.

Further, isolating individual devices in a circuit becomes increasingly complex as device density increases. Conventional device isolation is accomplished through use of well implants to form NMOS and PMOS regions and deep-etched shallow trench isolation (STI) regions to separate the NMOS and PMOS regions. However, it is desirable to electrically decouple the fins from the semiconductor substrate to further enhance device to device isolation.

Accordingly, it is desirable to provide semiconductor devices and methods of forming the semiconductor devices having fins with a portion thereof including III-V semiconductor material while minimizing defects in the fin due to differences in crystal lattices between the III-V materials and the material of a semiconductor substrate. It is also desirable to provide such semiconductor devices with the portion of the fin including the III-V semiconductor material electrically decoupled from the semiconductor substrate to minimize unwanted leakage and improve isolation. Furthermore, other desirable features and characteristics of the present invention will become apparent from the subsequent detailed description of the invention and the appended claims, taken in conjunction with the accompanying drawings and this background of the invention.

BRIEF SUMMARY

Semiconductor devices including a fin and method of forming the semiconductor devices are provided herein. In an embodiment, a method of forming a semiconductor device includes forming a fin overlying a semiconductor substrate. The fin is formed by epitaxially-growing a semiconductor material over the semiconductor substrate, and the fin has a first portion that is proximal to the semiconductor substrate and a second portion that is spaced from the semiconductor substrate by the first portion. A gate structure is formed over the fin and the semiconductor substrate. The first portion of the fin is etched to form a gap between the second portion and the semiconductor substrate.

In another embodiment, a method of forming a semiconductor device includes forming a fin overlying a semiconductor substrate. The fin is formed by epitaxially growing a semiconductor material over the semiconductor substrate, and the fin has a first portion that is proximal to the semiconductor substrate and a second portion that is spaced from the semiconductor substrate by the first portion. A gate structure is formed over the fin and the semiconductor substrate. The first portion of the fin is etched to form a gap between the second portion and the semiconductor substrate, and the gap is filled with a flowable dielectric material. After filling the gap with the flowable dielectric material, conventional front-end-of-line fabrication techniques can be conducted.

In another embodiment, a semiconductor device includes a semiconductor substrate that includes semiconductor material. A fin is disposed over the semiconductor substrate. The fin includes a dielectric portion that is proximal to the semiconductor substrate. The fin further includes a second portion that is spaced from the semiconductor substrate by the dielectric portion. The second portion includes an epitaxially-grown III-V semiconductor material.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Semiconductor devices that include a fin and methods of forming the semiconductor devices are provided herein. The semiconductor devices may be, for example, FinFET devices or devices that include nanowire structures. The fin is formed by epitaxially growing semiconductor material over a semiconductor substrate. The fin includes a first portion that is proximal to the semiconductor substrate and a second portion that is spaced from the semiconductor substrate. The first portion may have crystal lattice defects, i.e., epitaxial growth dislocations, due to differences in crystal lattice between the epitaxially-grown semiconductor material and the material of the semiconductor substrate, or the first portion may include intentionally different semiconductor material composition than the second portion. In both scenarios, sufficient etch selectivity is created such that the first portion may be etched to form a gap between the second portion and the semiconductor substrate, i.e., at least a portion of the second portion remains after etching the first portion. In this regard, the second portion may be formed from a variety of semiconductor materials that have a different crystal lattice from the semiconductor substrate (such as III-V semiconductor materials) while both minimizing defects in the fin due to differences in crystal lattices and also electrically decoupling the second portion from the semiconductor substrate. In various embodiments, the gap may be filled with a flowable dielectric material to maintain electrical insulation of the second portion in anticipation of further FinFET fabrication techniques. In other embodiments, the gap may remain unfilled to result in a semiconductor-on-nothing configuration, which may be employed for nanowire applications or gate-all-around MOSFETs.

Figure 1:
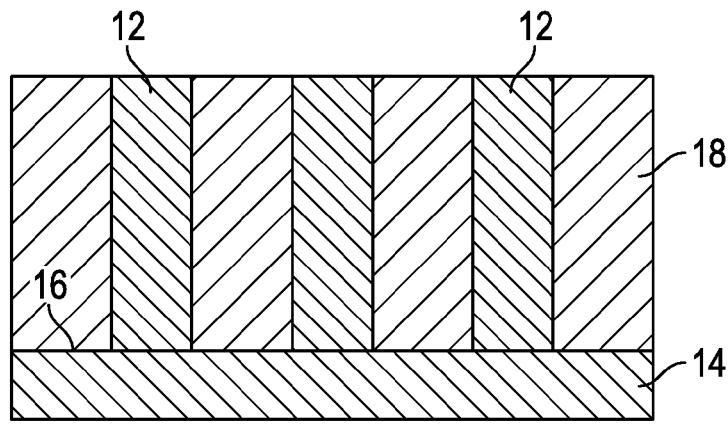
FIGS. 1-7 illustrate, in cross section, a method for forming a semiconductor device in accordance with an exemplary embodiment.

An embodiment of a method of forming a semiconductor device will now be described with reference to FIGS. 1-8. Referring to FIG. 1, a dummy fin 12 is first formed overlying a semiconductor substrate 14. The term "semiconductor substrate" will be used to encompass semiconductor materials conventionally used in the semiconductor industry from which to make electrical devices, such as silicon, germanium, or other semiconductor material. The semiconductor substrate 14 may also include one or more additional layers (not shown), such as an insulating layer, additional semiconductor layer, or the like. In embodiments, the dummy fin 12 may be formed by patterning the semiconductor substrate 14 to form the dummy fin 12, with the resulting dummy fin 12 including the same material as the semiconductor substrate. In other embodiments, the dummy fin 12 is formed directly on a surface 16 of the semiconductor substrate 14 such as by epitaxially growing semiconductor material on the surface 16 of the semiconductor substrate 14, and optional subsequent patterning. As shown in FIG. 1, it is to be appreciated that a plurality of dummy fins 12 may be formed overlying the semiconductor substrate 14.

As also shown in FIG. 1, a dielectric material is deposited adjacent to the dummy fin 12 to form an isolation layer 18. In particular, the isolation layer 18 is formed over the semiconductor substrate 14 to a height of the dummy fin 12, and planarization may be conducted to remove dielectric material that protrudes beyond the dummy fin 12. Suitable dielectric material may include any type of dielectric material that is resistant to etchants that are effective for etching the material of the dummy fin 12. Flowable oxides and spin-on glass are examples of suitable dielectric materials. The structure including the dummy fin 12 and isolation layer 18 may be annealed after forming the isolation layer 18, either prior to or after planarizing the isolation layer 18 onto substantially even plane with the dummy fin 12, in anticipation of dummy fin etching.

Figure 2:
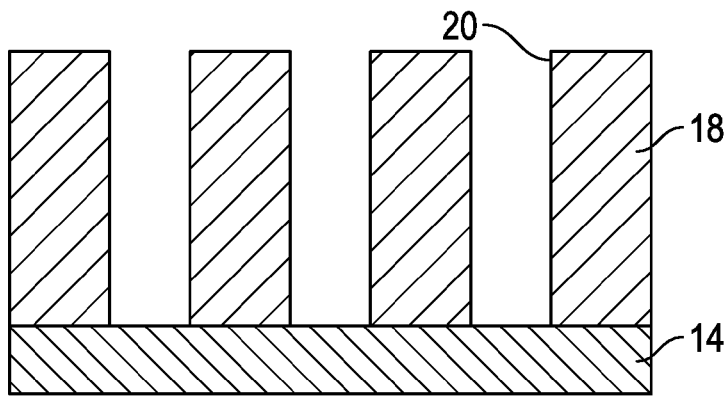

Referring to FIG. 2, the dummy fin is etched to form a fin recess 20 in the isolation layer 18. The fin recess 20 effectively provides a template for later formation of epitaxially-grown fins over the semiconductor substrate 14, as described in further detail below. The dummy fin may be etched through conventional techniques using an etchant that selectively etches the material of the dummy fin over the isolation layer 18. For example, the dummy fin may include silicon, and the dummy fin may be etching using an etchant that is selective to silicon, such as hydrochloric acid or ammonium hydroxide. The dummy fin may be completely or partially removed through etching.

Figure 3:
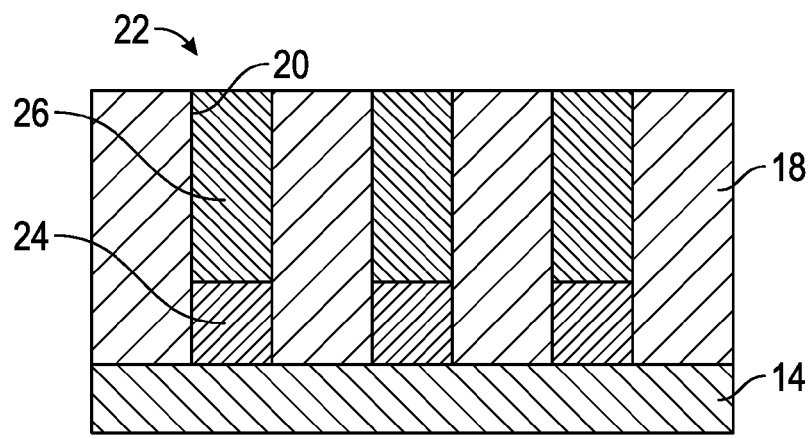

Referring to FIG. 3, a fin 22 is formed overlying the semiconductor substrate 14. In the embodiment shown, the fin 22 is formed directly on the semiconductor substrate 14. However, it is to be appreciated that in other embodiments and although not shown, a portion of the dummy fin may remain and the fin 22 may be formed directly on the portion of the dummy fin. The fin 22 is formed by epitaxially-growing a semiconductor material over the semiconductor substrate 14, such as in the fin recess 20. For example, a III-V semiconductor material may be epitaxially grown in the fin recess 20 to form the fin 22. The entire fin 22 may be formed from III-V semiconductor material, optionally with different portions of the fin 22 including different III-V semiconductor material. Alternatively, only a portion of the fin 22 may be formed from III-V semiconductor material, with other portions of the fin 22 including epitaxially-grown semiconductor material other than III-V semiconductor material. Examples of suitable III-V semiconductor materials include, but are not limited to, In(x)Ga(1−x)As where 0<=x<=1 or In(y)Ga(1−y)Sb where 0<=y<=1.

The fin 22 has a first portion 24 that is proximal to the semiconductor substrate 14 and a second portion 26 that is spaced from the semiconductor substrate 14 by the first portion 24. The first portion 24 is distinguishable from the second portion 26 either by the first portion 24 and the second portion 26 including different materials, or by the first portion 24 having crystal lattice defects, i.e., epitaxial growth dislocations, and the second portion 26 being substantially free of detectable crystal lattice defects but including the same material. In both embodiments, the first portion 24 may be selectively etched from the second portion 26 using particular etching techniques, as described in further detail below, thereby enabling removal of the first portion 24 without completely removing the second portion 26.

In an embodiment, the same material is included in the first portion 24 and second portion 26. For example, both the first portion 24 and second portion 26 may include a III-V semiconductor material that is epitaxially grown in the fin recess 20, and an aspect ratio trapping (ART) process may be employed to form the fin 22. To explain, in ART processes, the fin recess 20 has a high aspect ratio of height to width, such as greater than about 3:1, thereby enabling isolation of epitaxial growth dislocations in the first portion 24 of the fin 22. Formation of epitaxial growth dislocations are generally dependent on a given aspect ratio in the fin recess 20, with termination of the epitaxial growth dislocations occurring at sidewalls of the fin recess 20. Generation and termination of the epitaxial growth dislocations is substantially predictable and constant for a given aspect ratio and semiconductor material, with the first portion 24 of the fin 22 having crystal lattice defects due to epitaxial growth lattice mismatch, and the second portion 26 of the fin 22 having a crystal lattice of the III-V semiconductor material with minimal crystal lattice defects. Further, relative dimensions of the first portion 24 and the second portion 26 can be precisely controlled due to the correlation between termination of the epitaxial growth dislocations and the aspect ratio.

In another embodiment, different materials are included in the first portion 24 and the second portion 26, although both the first portion 24 and the second portion 26 are epitaxially grown. In this embodiment, a sacrificial semiconductor material is epitaxially grown in the fin recess 20 to form the first portion 24 of the fin 22, and the III-V semiconductor material (which is different from the sacrificial semiconductor material) is epitaxially grown over the first portion 24 to form the second portion 26 of the fin 22. The sacrificial semiconductor material and the III-V semiconductor of the second portion 26 have different etch rates in different etchants, as described in further detail below. In this regard, examples of suitable combinations of sacrificial semiconductor material of the first portion 24 and III-V semiconductor material of the second portion 26 are as follows: for III-V semiconductor material in the second portion 26 that includes $In(x)Ga(1-x)As$ where $0<=x<=1$, suitable sacrificial semiconductor material for the first portion 24 may be chosen from $In(w)Al(1-w)As$ where $0<=w<=1$, InP, GaSb, $In(x)Ga(1-x)Sb$ where $0<=x<=1$, $Al(y)Ga(1-y)Sb$ where $0<=y<=1$, $AlAs(z)Sb(1-z)$ where $0<=z<=1$, Ge, SiGe or Si; for III-V semiconductor material in the second portion 26 that includes $In(y)Ga(1-y)Sb$ where $0<=y<=1$, suitable sacrificial semiconductor material for the first portion 24 may be chosen from $In(x)Ga(1-x)As$ where $0<=x<=1$, $Al(y)Ga(1-y)Sb$ where $0<=y<=1$, $AlAs(z)Sb(1-z)$ where $0<=z<=1$, Ge, SiGe or Si.

Figure 4:
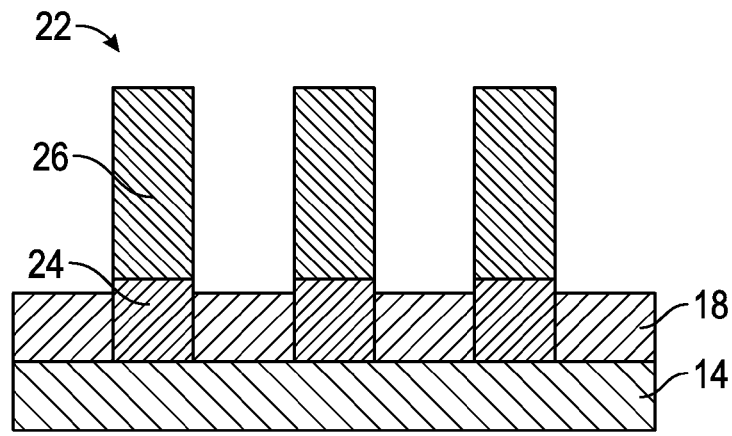

Referring to FIG. 4, after forming the fin 22, the isolation layer 18 may be at least partially removed. In particular, the isolation layer 18 may be etched with an appropriate etchant based on the material of the isolation layer 18 to expose the first portion 24 of the fin 22 allowing device formation on the exposed fins 22, and more easily facilitate later removal of the first portion 24 through etching. For example, the etchant may be an oxide etchant such as but not limited to an $HF/H_2O$ solution, or a dry etchant such as SiCoNi (AMAT).

Figure 5:
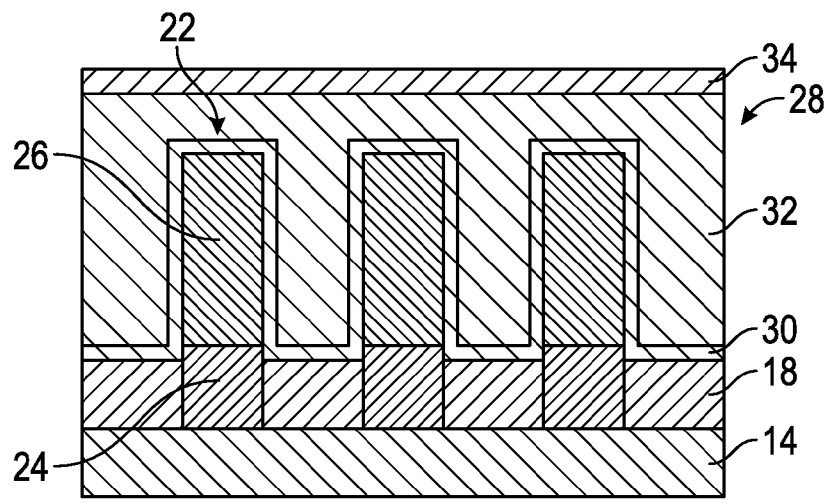

Referring to FIG. 5, after recessing the isolation layer 18, a gate structure 28 may be formed over the fin 22 and the semiconductor substrate 14. The gate structure 28 may be formed in physical contact with the semiconductor substrate 14 to support the second portion 26 of the fin 22 during and after removal of the first portion 24. The gate structure 28 may be a dummy gate structure that will eventually be removed after further FEOL fabrication techniques, or may be a permanent structure employed as part of a transistor. The gate structure 28 may be formed through conventional techniques and may include conventional features of a gate. For example, a gate insulation layer 30 may be formed after etching the isolation layer 18, followed by depositing electrically-conductive material over the gate insulation layer 30 to form a gate electrode 32 over the gate insulation layer 30 with the gate electrode 32 being insulated from the second portion 26 of the fin 22 by the gate insulation layer 30. A gate cap 34 may be formed over the gate electrode 32, and the gate structure 28 may be patterned into a desired form.

Figure 6:
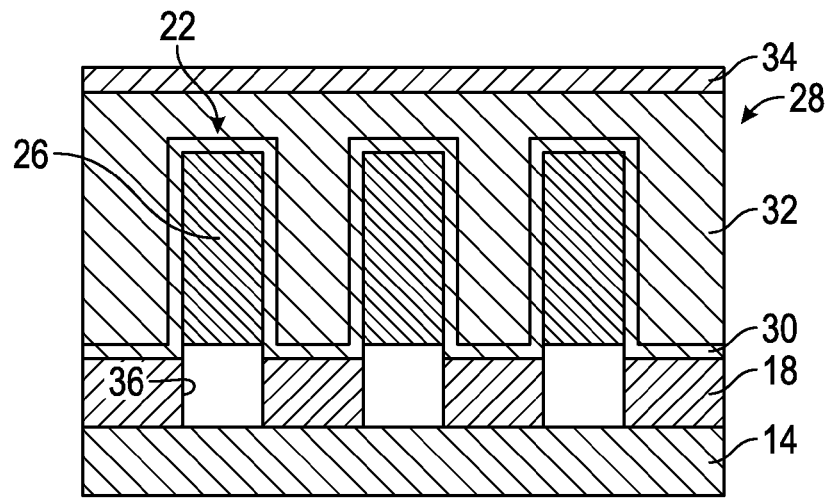

Referring to FIG. 6, after forming the gate structure 28, the first portion of the fin 22 is etched to form a gap 36 between the second portion 26 and the semiconductor substrate 14. The gate structure 28 supports the second portion 26 after etching the first portion to maintain the gap 36. As set forth above, the first portion may be selectively etched relative to the second portion 26 with an etchant that is selective to the material in the first portion. For example, $In(x)Ga(1-x)As$ where $0<=x<=1$ and that includes crystal lattice defects can be selectively etched over the same material that is substantially free of crystal lattice defects using hot nitric or sulfuric acid, A/B etchant, or molten KOH. As another example, $In(y)Ga(1-y)Sb$ where $0<=y<=1$ and that includes crystal lattice defects can be selectively etched over the same material that is substantially free of crystal lattice defects using hot nitric or sulfuric acid, A/B etchant, or molten KOH. As another example, sacrificial semiconductor materials chosen from $In(w)Al(1-w)As$ where $0<=w<=1$, InP, Ge, SiGe, Si, $Al(y)Ga(1-y)Sb$ where $0<=y<=1$, and $AlAs(z)Sb(1-z)$ where $0<=z<=1$ can be selectively etched using HF or HCl, provided that no oxidizing agents such as $H_2O_2$ are employed. As another example, GaSb and $In(x)Ga(1-x)Sb$ where $0<=x<=1$ can be selectively etched using basic solutions such as $NH_4OH$. As another example, $In(x)Ga(1-x)As$ where $0<=x<=1$ can be selectively etched using pH-balanced citric acid or succinic acid. It is to be appreciated that the aforementioned etching techniques are merely exemplary and that other selective etching of the materials in the first portion may be accomplished with other etchants.

Figure 7:
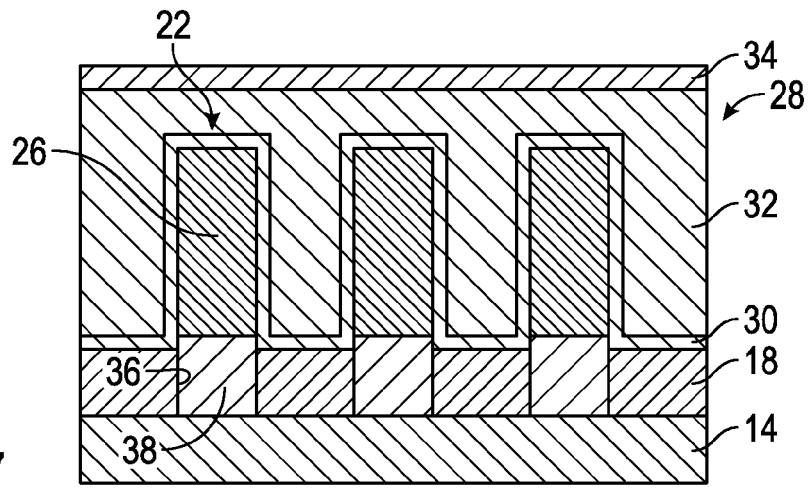

In an embodiment and as shown in FIG. 7, the gap 36 is filled with a flowable dielectric material, such as a flowable oxide, to form a dielectric portion 38. Flowable oxides are known in the art, and one specific example of a flowable oxide is hydrogen silsesquioxane-based oxide. The flowable dielectric material may be formed by spin-on deposition of the flowable dielectric material in liquid form, or by chemical vapor deposition (CVD). Oxide deposition is then followed by reheating to facilitate flow of the dielectric material into the gap 36. This oxide may then optionally be recessed using a self-aligned technique following the flowing process.

Figure 8:
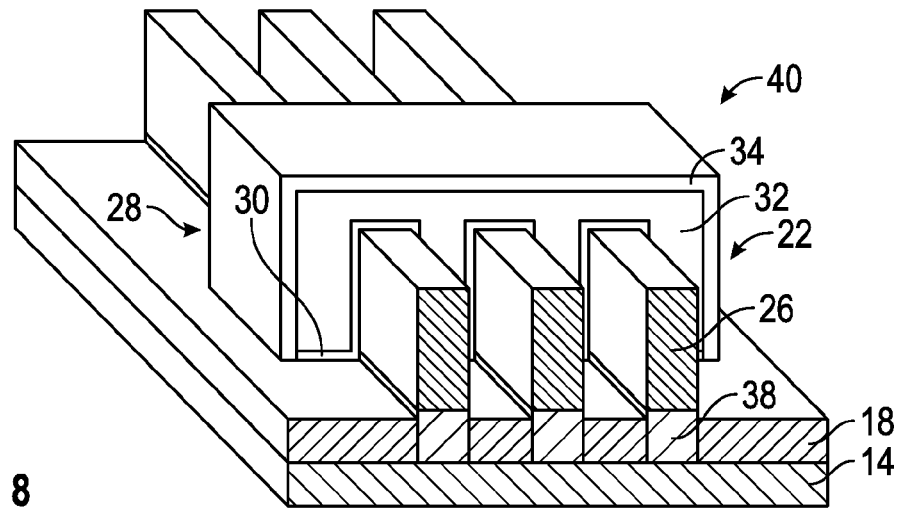
FIG. 8 is a partial perspective view of a portion of the semiconductor device formed in accordance with the method of FIGS. 1-7.

In an embodiment and referring to FIG. 8, the resulting semiconductor device 40 includes the fin 22 that includes the second portion 26, with the second portion 26 including the epitaxially-grown III-V semiconductor material. In this embodiment, the fin also includes the dielectric portion 38. In embodiments, front-end-of-line (FEOL) fabrication techniques are conducted after filling the gap 36 with the flowable dielectric material, with the second portion 26 electrically decoupled from the semiconductor substrate 14 by the dielectric portion 38. Conventional FEOL fabrication techniques may be employed for FinFET fabrication on the fin 22. In embodiments, the gate structure 28 is removed after etching the first portion of the fin 22, more particularly after forming the dielectric portion 38 because support of the second portion 26 is no longer required. It is to be appreciated that the gate structure 28 may remain in place during further the FEOL fabrication technique and there is no limitation to a particular stage during fabrication where the gate structure 28 must be removed.

Figure 9:
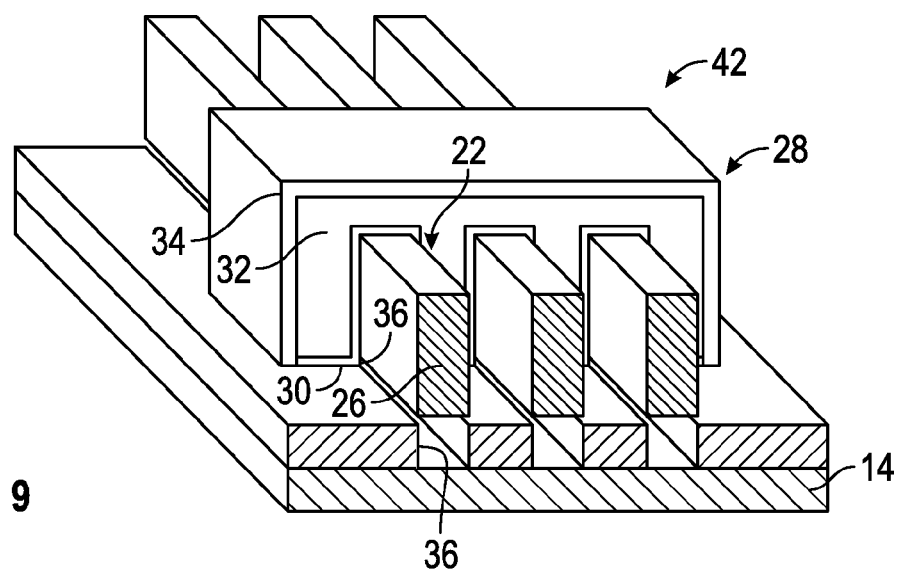
FIG. 9 is a partial perspective view of another embodiment of a portion of a semiconductor device formed in accordance with another exemplary method.

In an alternative embodiment and referring to FIG. 9, the gap 36 remains unfilled after etching the first portion. In this embodiment, a semiconductor device 42 having a semiconductor-on-nothing configuration is formed, with the second portion 26 remaining spaced from the semiconductor substrate 14 by the gap 36. The semiconductor-on-nothing configuration enables further FEOL processing to form gate-all-around MOSFETs. Alternatively, with the second portion 26 spaced from the semiconductor substrate 14, nanowire applications for the second portion 26 are possible.

Figure 10:
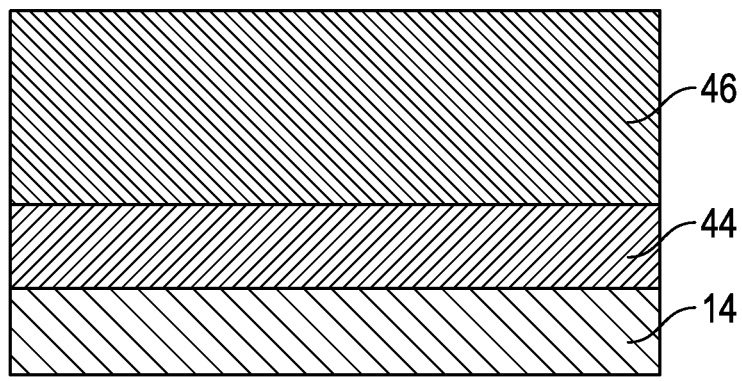
FIGS. 10-12 illustrate, in cross section, another method for forming a semiconductor device in accordance with another exemplary embodiment.
Figure 11:
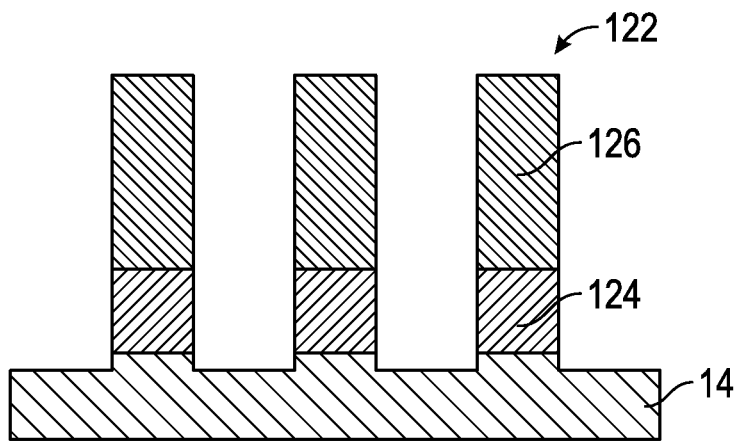
Figure 12:
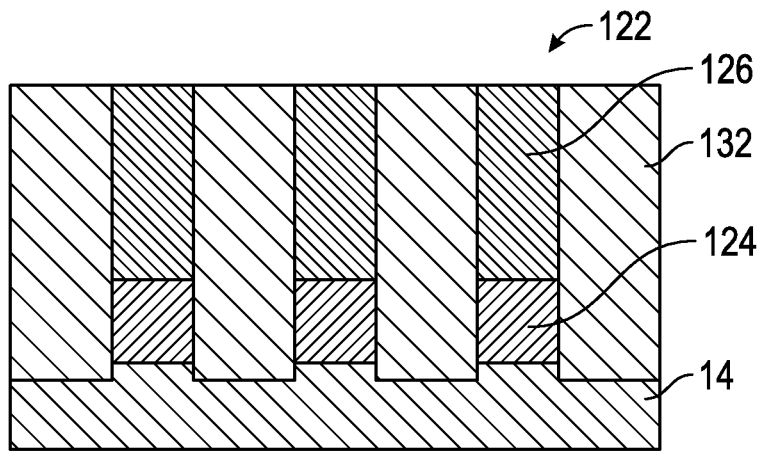

Another embodiment of an exemplary method of forming a semiconductor device will now be described with reference to FIGS. 10-12. In this embodiment, fins are formed on the semiconductor substrate 14 without using dummy fins. In particular, in an embodiment and referring to FIG. 10, a first portion layer 44 and a second portion layer 46 are first formed overlying a semiconductor substrate 14. The first portion layer 44 and the second portion layer 46 may include the same materials described above for the first portion 24 and the second portion 26, respectively, and are formed by epitaxially growing the material over the semiconductor substrate 14. Referring to FIG. 11, fins 122 are then patterned into the first portion layer and the second portion layer through etching to form a first portion 124 and a second portion 126 of the fin 122. As also shown in FIG. 11, some over-etch into the semiconductor substrate 14 is possible, although not required. Referring to FIG. 12, a dielectric material is deposited adjacent to the fin 122 to form an isolation layer 132 in the same manner as described above. The exemplary method may then proceed in the same manner as described above and as shown in FIGS. 4-7, and the semiconductor devices 40, 42 as shown in FIGS. 8 and 9, respectively, may be formed in accordance with this exemplary method.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming a semiconductor device, wherein the method comprises:
   forming a fin overlying a semiconductor substrate, wherein forming the fin comprises patterning a dummy fin in the semiconductor substrate, depositing a dielectric material adjacent to the dummy fin to form an isolation layer, etching the dummy fin to form a fin recess in the isolation layer, and epitaxially-growing a semiconductor material over the semiconductor substrate in the fin recess, wherein the fin has a first portion proximal to the semiconductor substrate and a second portion spaced from the semiconductor substrate by the first portion;
   forming a gate structure over the fin and the semiconductor substrate;
   etching the first portion of the fin to form a gap between the second portion and the semiconductor substrate.

2. The method of claim 1, wherein etching the first portion of the fin comprises etching the first portion with the gate structure supporting the second portion to maintain the gap after etching.

3. The method of claim 1, wherein the gate structure is further defined as a dummy gate structure, and wherein the method further comprises removing the dummy gate structure after etching the first portion of the fin.

4. The method of claim 1, further comprising filling the gap with a flowable dielectric material.

5. The method of claim 1, wherein epitaxially-growing the semiconductor material comprises epitaxially growing a III-V semiconductor material.

6. The method of claim 5, wherein the semiconductor substrate is a silicon substrate, and wherein forming the fin comprises epitaxially growing the III-V semiconductor material over the silicon substrate to form the fin having the first portion having crystal lattice defects and the second portion having a crystal lattice of the III-V semiconductor material.

7. The method of claim 6, wherein epitaxially growing the III-V semiconductor material comprises epitaxially growing the III-V semiconductor material chosen from $In(x)Ga(1-x)As$ where $0<=x<=1$ or $In(y)Ga(1-y)Sb$ where $0<=y<=1$.

8. The method of claim 6, wherein etching the first portion comprises etching the first portion with a first etchant selective to the first portion having the crystal lattice defects over the second portion having the crystal lattice of the III-V semiconductor material.

9. The method of claim 5, wherein forming the fin comprises epitaxially growing a sacrificial semiconductor material to form the first portion of the fin and epitaxially growing the III-V semiconductor material different from the sacrificial semiconductor material to form the second portion of the fin over the first portion.

10. The method of claim 9, wherein epitaxially growing the III-V semiconductor material comprises epitaxially growing $In(x)Ga(1-x)As$ where $0<=x<=1$.

11. The method of claim 10, wherein epitaxially growing the sacrificial semiconductor material comprises epitaxially growing semiconductor material chosen from $In(w)Al(1-w)As$ where $0<=w<=1$, InP, GaSb, $In(x)Ga(1-x)Sb$ where $0<=x<=1$, $Al(y)Ga(1-y)Sb$ where $0<=y<=1$, $AlAs(z)Sb(1-z)$ where $0<=z<=1$, Ge, SiGe, or Si.

12. The method of claim 9, wherein epitaxially growing the III-V semiconductor material comprises epitaxially growing $In(y)Ga(1-y)Sb$ where $0<=y<=1$.

13. The method of claim 12, wherein epitaxially growing the sacrificial semiconductor material comprises epitaxially growing semiconductor material chosen from $In(x)Ga(1-x)As$ where $0<=x<=1$, $Al(y)Ga(1-y)Sb$ where $0<=y<=1$, $AlAs(z)Sb(1-z)$ where $0<=z<=1$, Ge, SiGe, or Si.

14. The method of claim 9, wherein etching the first portion comprises etching the first portion with a second etchant selective to the sacrificial semiconductor material over the III-V semiconductor material.

15. A method of forming a semiconductor device, wherein the method comprises:
   forming a fin overlying a semiconductor substrate, wherein forming the fin comprises patterning a dummy fin in the semiconductor substrate, depositing a dielectric material adjacent to the dummy fin to form an isolation layer, etching the dummy fin to form a fin recess in the isolation layer, and epitaxially-growing a semiconductor material over the semiconductor substrate in the fin recess, wherein the fin has a first portion proximal to the semiconductor substrate and a second portion spaced from the semiconductor substrate by the first portion;
   forming a gate structure over the fin and the semiconductor substrate;
   etching the first portion of the fin to form a gap between the second portion and the semiconductor substrate;
   filling the gap with a flowable dielectric material; and
   conducting a front-end-of-line fabrication technique after filling the gap with the flowable dielectric material.

16. A method of forming a semiconductor device, wherein the method comprises:
   forming a fin overlying a silicon substrate, wherein forming the fin comprises epitaxially-growing a III-V semiconductor material over the silicon substrate, wherein the fin has a first portion having crystal lattice defects and disposed proximal to the semiconductor substrate and a second portion having a crystal lattice of the III-V semiconductor material and spaced from the semiconductor substrate by the first portion, and wherein the same material is included in the first portion and the second portion;

forming a gate structure over the fin and the semiconductor substrate;
etching the first portion of the fin to form a gap between the second portion and the semiconductor substrate.

* * * * *